(12) United States Patent
Beasom

(10) Patent No.: US 6,822,314 B2
(45) Date of Patent: Nov. 23, 2004

(54) BASE FOR A NPN BIPOLAR TRANSISTOR

(75) Inventor: James D. Beasom, Melbourne Village, FL (US)

(73) Assignee: Intersil Americas Inc., Milpitas, CA (US)

(*) Notice: Subject to any disclaimer, the term of this patent is extended or adjusted under 35 U.S.C. 154(b) by 0 days.

(21) Appl. No.: 10/171,349

(22) Filed: Jun. 12, 2002

(65) Prior Publication Data

US 2003/0230789 A1 Dec. 18, 2003

(51) Int. Cl.[7] ............... H01L 27/82; H01L 27/102; H01L 29/70; H01L 31/11
(52) U.S. Cl. ........................................... 257/592
(58) Field of Search .................. 257/565–709

(56) References Cited

U.S. PATENT DOCUMENTS

| | | | | |
|---|---|---|---|---|
| 5,331,199 A | * | 7/1994 | Chu et al. | 257/587 |
| 6,459,140 B1 | * | 10/2002 | Johansson et al. | 257/592 |
| 6,570,242 B1 | * | 5/2003 | Johnson | 257/593 |

* cited by examiner

*Primary Examiner*—Long Pham
*Assistant Examiner*—Dana Farahani
(74) *Attorney, Agent, or Firm*—Fogg and Associates, LLC; Scott V. Lundberg

(57) ABSTRACT

An improved base for a NPN bipolar transistor. The base region is formed with Boron and Indium dopants for improved beta early voltage product and reduced base resistance.

13 Claims, 3 Drawing Sheets

BASE FOR A NPN BIPOLAR TRANSISTOR

TECHNICAL FIELD

The present invention relates generally to semiconductor devices and in particular the present invention relates to an improved base for a NPN bipolar transistor.

BACKGROUND

Solid state devices are typically made from semiconductor material. Semiconductor material is a material that has a resistance that lies between that of a conductor and an insulator. In creating a device in semiconductor material, device regions are formed to be either N conductivity type (N type) or P conductivity type (P type). The N type semiconductor material is doped with a donor type impurity that generally conducts current via electrons. P type semiconductor material is doped with acceptor-type impurities that conducts current via hole migration. One example of a solid state device is a bipolar NPN transistor. A bipolar NPN transistor is made of a N type emitter, a P type base and a N type collector.

One common method of creating a P type base is by introducing Boron dopants into a select region of the semiconductor material. More recently, the use of Indium has been used to create the P type base. The use of Indium provides an improved beta early voltage product ($h_{FE}$-$V_A$ product). Wherein $h_{FE}$ is the transistor gain (beta) and $V_A$ is early voltage. Basically, the early voltage is a measure of how rapidly the depletion layer from a base-collector junction spreads into a base thereby changing the net base doping in non-depleted portions of the base. A high beta early voltage product is achieved by minimizing the spread of the depletion layer into the base. Indium dopants are effective in holding back the depletion layer to achieve an improved beta early voltage product.

In particular, the improved beta early voltage product acquired with the use of Indium results in increased collector currents and collector-emitter gains as compared to boron implanted transistor bases. The increase in beta early voltage product arises from the fact that Indium resides farther from the band edge than Boron. Because of this, Indium in neutral regions partially freezes-out. That is, a lot of the Indium dopant (which in this case is an acceptor) does not accept an electron from the valence band thereby forming holes. In the depleted regions (relevant to its performance here) the Indium in the base-collector depletion region is totally ionized. The result is, that beta (which is set by the low fraction of ionized indium in the non-depleted portions of the base) is high while the spread of the base-collector depletion layer into the base (which is set by the higher fraction of ionized indium in the depleted layer) is low compared to base regions formed with Boron implant. The hole concentration of Indium is given by the following hole concentration equation:

$$p = \frac{2N_A}{1 + \sqrt{1 + 4g_A \frac{N_A}{N_V \exp\left(\frac{E_v - E_A}{kT}\right)}}}$$

In the hole concentration equation, p is the hole concentration, $N_A$ is the indium concentration, $g_A$ is a degeneracy factor which is approximately equal to 4, $E_V$ is a valence band edge energy, $E_A$ is an acceptor (Indium) ionization energy, k is Boltzman's constant and T is the absolute temperature.

One limitation of a device made with an Indium base is that the device will have a high base resistance. The base resistance is inversely proportional to the integrated doping in the neutral or un-depleted base region. A high base resistance leads to high noise in the device. So even though you can achieve a relatively high beta early stage product in a device with a base doped with Indium, the relatively high base resistance created by the Indium dopant limits the applicability of the device. It is desired in the art to have a device with a base that has relatively high beta early voltage product and relatively low base resistance.

For the reasons stated above and for other reasons stated below which will become apparent to those skilled in the art upon reading and understanding the present specification, there is a need in the art for a device with a base that has relatively high beta early voltage product and relatively low base resistance.

SUMMARY

The above-mentioned problems are addressed, as well as other problems, by the present invention and will be understood by reading and studying the following specification.

In one embodiment, a base region for a NPN transistor is disclosed. The ion comprises Boron and Indium dopants. The Boron and Indium dopants form region of P conductivity type.

In another embodiment, a NPN transistor is disclosed. The NPN transistor includes a collector, a base and an emitter. The collector is of an N conductivity type and is formed in a substrate. The substrate has a working surface. The base is of a P conductivity type and is formed in the collector adjacent the working surface of the substrate. The P conductivity type base is formed with both Boron and Indium dopants. The emitter is of the N conductivity type and is formed in the base adjacent the working surface of the substrate.

In another embodiment, another base region for a NPN transistor is disclosed. The base region comprises Boron dopants and Indium dopants. The ratio of Indium dopants to Boron dopants is selected to create a desired current gain temperature coefficient.

In another embodiment, a method of forming a base region in an NPN transistor is disclosed. The method comprises diffusing Boron dopants through a select region of working surface of a substrate and implanting Indium dopants through the select region of the working surface of the substrate.

In another embodiment, another method of forming a base region in an NPN transistor is disclosed. The method comprises epitaxially growing the base region with Boron and Indium dopants.

In another embodiment, a method of forming a NPN transistor is disclosed. The method comprises forming a collector in a substrate with N conductivity type dopants. The substrate has a working surface. Forming a base region in the collector adjacent the working surface of the substrate with P conductivity type dopants, wherein the P type conductivity type dopants are both Boron and Indium dopants. Forming an emitter region in the base region adjacent the working surface of the substrate with the N conductivity type dopants.

In another embodiment, a method of forming a base region in a NPN transistor is disclosed. The method comprises introducing a select amount of Indium dopants to the base region and introducing a select amount of Boron dopants to the base region, wherein the ratio of the select amount of the Indium dopants to the select amount of Boron dopants is selected to determine the beta temperature coefficient of the NPN transistor.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Figure 1:
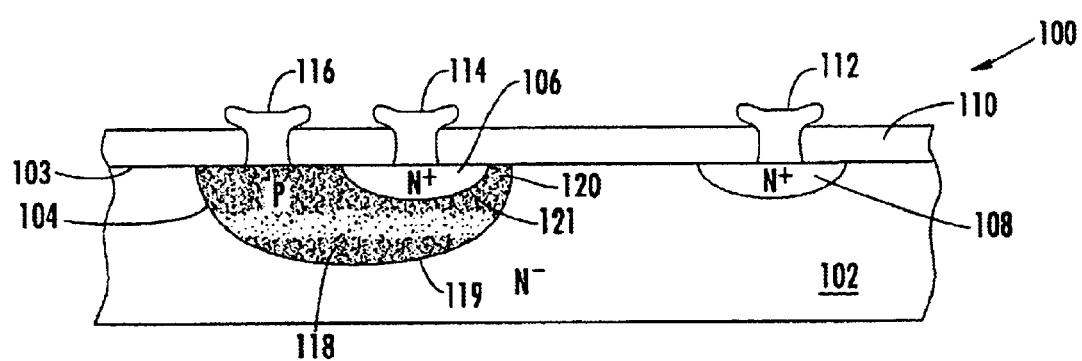
FIG. 1 is a cross-sectional view of a NPN transistor in an integrated circuit of the present invention.

The present invention employs both Boron and Indium in a base region to form a device with relatively high beta early voltage and a relatively low base resistance. In particular, embodiments of the invention use both Boron and Indium dopants in the base in such a manner that the boron dopants are the major factor in determining the base resistance and the Indium dopants are the major factor in determining the early voltage. Referring to FIG. 1, a cross-sectional view of one embodiment of a NPN transistor 100 of the present invention is illustrated. As illustrated, the NPN transistor includes a substrate 102 upon which device regions are formed. In this embodiment, the substrate 102 is doped with N type dopants to form collector 102. Device regions are then formed in the collector 102. In particular, the device regions include the base 104, the emitter 106 and the collector contact 108. Further illustrated is a dielectric layer 110 formed on a working surface of the substrate 103. Also included in FIG. 1, is a collector contact region 112, an emitter contact region 114 and a base contact region 116.

As further illustrated in FIG. 1, the base region 104 of this embodiment of the present invention concentrates Indium dopants 118 near the base-collector junction 119 and Boron dopants 120 near the base-emitter junction 121. A peak concentration of Indium dopants 118 is positioned near the base-collector junction 119 because this is where the early voltage is set. A peak concentration of Boron dopants 120 is positioned near the base-emitter junction 121 because that is where the base resistance is set. In another embodiment, the Boron 120 doping at the emitter-base junction 121 is greater than the ionized Indium doping at room temperature. In yet another embodiment, the peak concentration of Indium doping 118 is deeper from the working surface 103 of the substrate than the peak concentration of Boron doping 120.

Figure 2A:
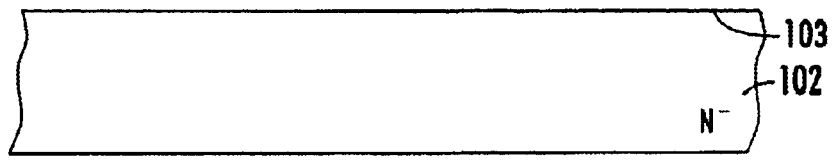
FIGS. 2A to 2E are cross-sectional views illustrating one method of the forming an embodiment of the present invention.
Figure 2B:
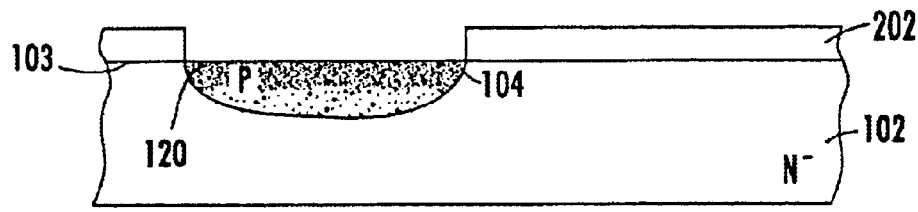
Figure 2C:
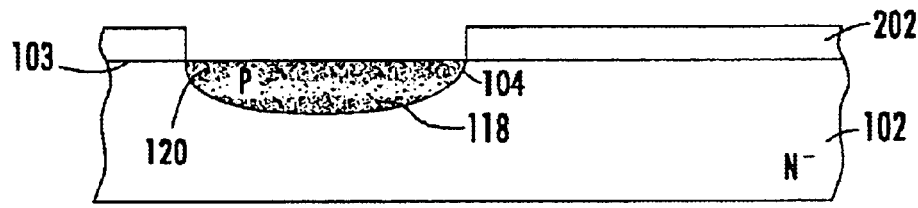

In FIGS. 2A to 2D cross-sectional views of the formation of one embodiment of the present invention is illustrated. Referring to FIG. 2A, a substrate 102 is first doped with low density N type dopants which turns the substrate 102 into a collector region 102 of a NPN transistor. Base mask 202 is formed on the working surface 103 of the substrate 102 at FIG. 2B. Base region 104 is first formed by a diffused profile of Boron implant. In this embodiment, Indium 118 is then introduced into the base as an implanted profile as illustrated in FIG. 2C. The location of the Indium dopants is approximately determined by implant in this embodiment.

Figure 2D:
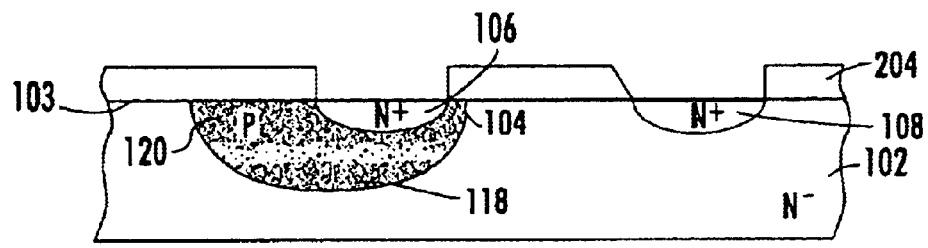
Figure 2E:
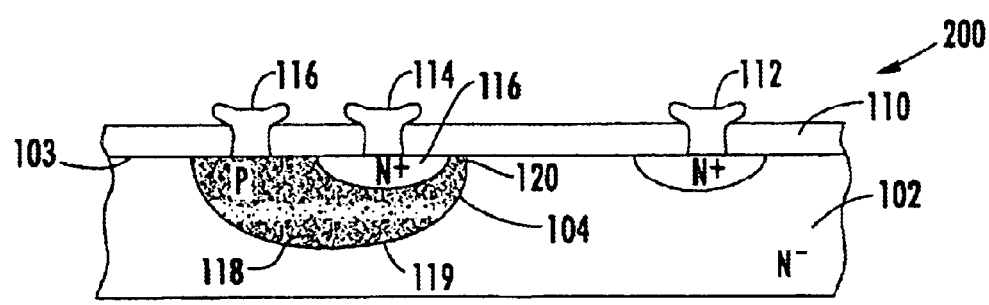

Next the base mask 202 is removed and an emitter-collector mask 204 is formed on the substrate surface 103 as illustrated in FIG. 2D. The emitter 106 and the collector contact 108 are then formed by implanting dopants of the N type in high density and optionally diffusing them to final junction depth as illustrated in FIG. 2D. The emitter-collector mask 204 is then removed. Referring to FIG. 2E an embodiment of a NPN transistor 200 is illustrated. In particular, FIG. 2E illustrates that a dielectric layer 110 is then formed on the working surface 103 of the substrate 102. The collector contact region 112, emitter contact region 114 and base contact region 116 are then formed.

Figure 3:
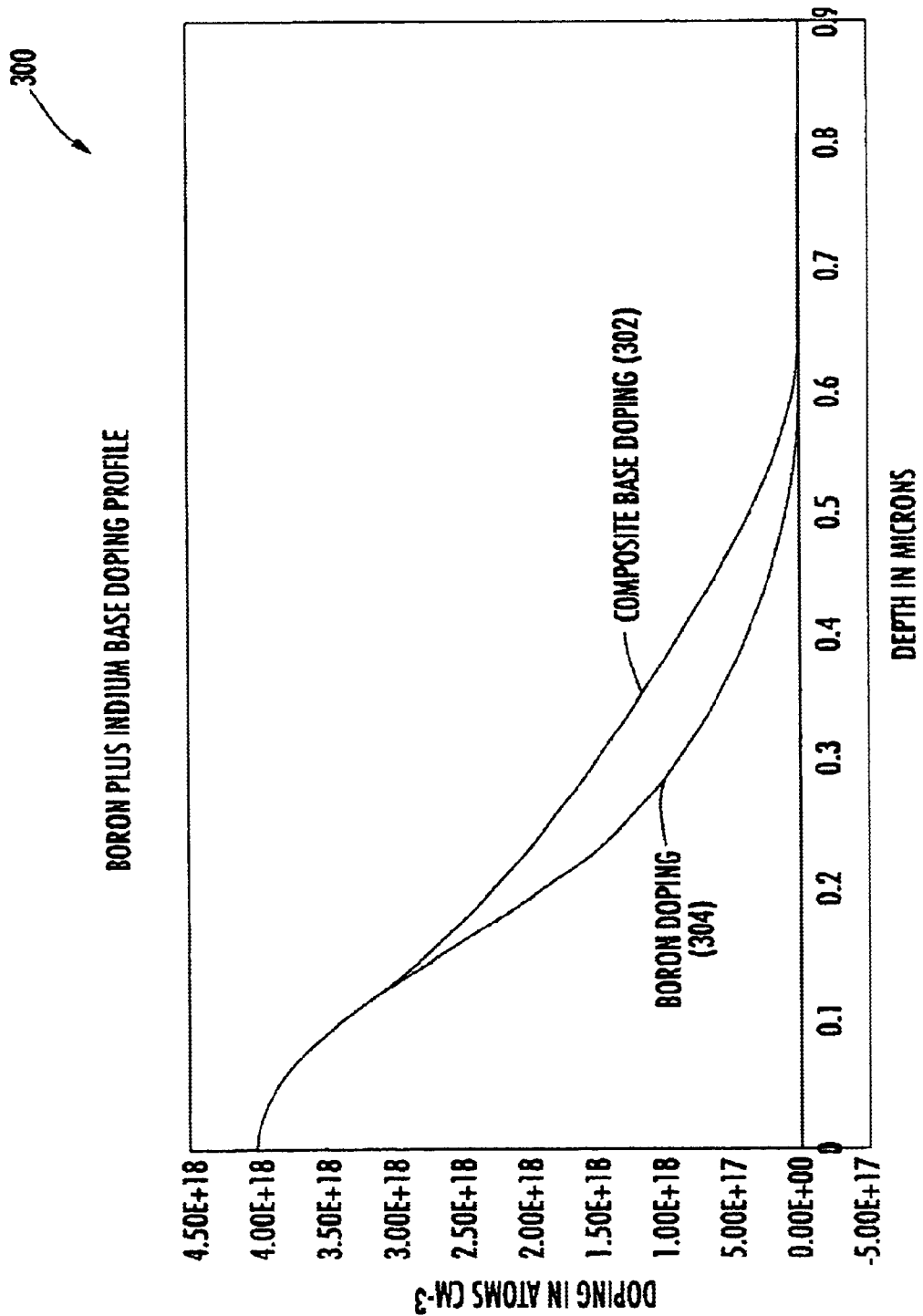
FIG. 3 is a base profile graph illustrating the doping profile of a base of one embodiment of the present invention.

FIG. 3 includes a base profile graph 300 of the base doping profile of one embodiment of the present invention. As illustrated, the base profile graph 300 shows a diffused Boron profile (304) and a composite base doping profile (302). The boron profile is diffused with a Dt=1.5E−10 and a surface concentration (after diffusion) of 4.00E18. The Indium profile is modeled as a gaussian implant at an energy level of 1MeV and a dose of 1.7E13. Moreover, the gaussian profile of Indium dopants has a peak concentration below the working surface. Although not shown (for clarity purposes), the emitter in this embodiment is doped with a concentration of 1E16 and has a depth about 0.6 microns. In addition, the collector contact in this embodiment is doped at approximately 1E16. The base-collector junction depth is about 0.7 microns compared to a junction depth of about 0.6 microns if the Indium implant is omitted. Moreover, a slight decrease in the Indium dose or energy would leave the base-collector junction depth set entirely by the Boron profile.

Other methods for forming the base 104 besides diffusing the Boron and implanting the Indium are possible. For example, in one embodiment of the present invention both the Boron and the Indium are implanted. In another embodiment, both the Boron and Indium profiles are diffused. In yet another embodiment, the Boron and Indium profiles are grown by epitaxial methods that vary the doping across the epitaxial grown base.

The early voltage of the base that includes Indium and Boron, as illustrated in FIG. 3, is about 146V while the early voltage of a similar base without Indium is only about 67V. In addition, base resistance is about 8.5 kohms per square for an Indium and Boron base, which is what would be a typical value for a Boron only base in a NPN transistor. Accordingly, the beta early voltage product can be improved with mixed Indium and Boron dopants without the high base resistances found in Indium only bases.

In other embodiments of the present invention, the temperature coefficient (TC) of beta is adjusted by varying the ratio of Indium to Boron in the base. By varying the temperature coefficient desired operating characteristics are achieved. For example, by adjusting the temperature coefficient to a relatively low positive value, beta is increased at low temperatures. This allows for designs that require less base current over a range of temperatures to achieve a desired collector current, since the minimum beta (beta= collector current/base current) over the range of temperatures is higher.

In a typical transistor made with a shallow base dopant like Boron, the magnitude of the beta TC is set mostly by band gap narrowing caused by emitter doping concentration. Since the TC in the typical transistor is positive, the beta increases as the temperature goes up. However, since the fraction of Indium frozen out changes with temperature, the beta TC can be adjusted by adjusting the ratio of Indium to Boron in the base. Referring to Table 1, the ratio of hole concentration to Indium acceptor concentration at three absolute temperatures is shown.

TABLE 1

| Induim doping in cm-3 | Ratio at 213 | Ratio at 293 | Ratio at 393 |
| --- | --- | --- | --- |
| 2.00E+18 | 1.89E-02 | 6.70E-02 | 1.61E-01 |
| 1.50E+18 | 2.18E-02 | 7.69E-02 | 1.84E-01 |
| 1.00E+18 | 2.66E-02 | 9.33E-02 | 2.20E-01 |
| 8.00E+17 | 2.97E-02 | 1.04E-01 | 2.42E-01 |
| 6.00E+17 | 3.42E-02 | 1.19E-01 | 2.74E-01 |
| 4.00E+17 | 4.17E-02 | 1.43E-01 | 3.24E-01 |
| 2.00E+17 | 5.85E-02 | 1.96E-01 | 4.23E-01 |
| 1.00E+17 | 8.17E-02 | 2.66E-01 | 5.36E-01 |
| 8.00E+16 | 9.09E-02 | 2.92E-01 | 5.74E-01 |
| 6.00E+16 | 1.04E-01 | 3.28E-01 | 6.24E-01 |
| 4.00E+16 | 1.26E-01 | 3.85E-01 | 6.92E-01 |

TABLE 1-continued

| Induim doping in cm-3 | Ratio at 213 | Ratio at 293 | Ratio at 393 |
| --- | --- | --- | --- |
| 2.00E+16 | 1.73E-01 | 4.93E-01 | 7.96E-01 |
| 1.00E+16 | 2.36E-01 | 6.11E-01 | 8.76E-01 |

As Table 1 illustrates, the hole concentration of Indium varies with temperature in accordance with the hole concentration equation:

$$p = \frac{2N_A}{1 + \sqrt{1 + 4g_A \frac{N_A}{N_V \exp\left(\frac{E_v - E_A}{kT}\right)}}}$$

As stated above, in embodiments of the present invention, the Beta TC is adjusted by varying the ratio of Indium to Boron in the base. The following beta equation explains how adjusting the Indium to Boron in the base changes the beta TC:

$$\text{beta} = \frac{Dn \int_o^{xie} Nd\,dx}{Dp \int_o^{w} Na\,dx}$$

In the beta equation, 0 is taken at the emitter base junction, xie is the thickness of the emitter, W is the base width, Nd is the ionized doping concentration in the emitter, Na is the ionized doping concentration of the base, Dn is the average diffusion coefficient of electrons in the base and Dp is the average diffusion coefficient of holes in the emitter. Since the base doping in the neutral base is a denominator term in the beta equation, the beta TC can be reduced by increasing the ratio of Indium to Boron in the neutral base. In particular, the integral in the denominator gives the sum of the ionized Boron and ionized Indium atoms in the non-depleted base. Moreover, Boron dopant atoms are ionized at all temperatures at which transistors are normally used while the Indium atoms are only partially ionized. This is illustrated by the data in Table 1. As a result, the value of the integral (sum of ionized Boron and ionized Indium integrated doping) changes as the fraction of Indium dopant atoms ionized changes. This is illustrated in Table 2 below:

TABLE 2

| Temperature | Boron ionized integrated doping in ions cm-2 | Indium ionized integrated doping in ions cm-2 | Indium/Boron Ratio |
| --- | --- | --- | --- |
| -55 C. | 7.6E12 | 4.3E11 | 0.057 |
| 25 C. | 7.6E12 | 1.4E12 | 0.18 |
| 125 C. | 7.6E12 | 3.9E12 | 0.51 |

For example, Table 2 shows that the addition of the Indium implant will decrease beta approximately 18 at 25C but only approximately 5% at -55C compared to the same device without the Indium implant. Accordingly, the beta TC can be varied by selectively changing the ratio of Indium to Boron in the base.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A base region for a NPN transistor, the base region comprising:

Boron dopants; and

Indium dopants, wherein the Boron and Indium dopants form the base region of P conductivity type, wherein the concentration of Indium dopants is greater than the concentration of Boron dopants at a base-collector junction.

2. The base region of claim 1, wherein the concentration of Boron dopants is greater than the concentration of Indium dopants at a base-emitter junction.

3. The base region of claim 1, wherein a peak concentration of the Indium dopants is formed deeper from a working surface of a substrate in which the NPN transistor is formed than a peak concentration of boron dopants is formed.

4. The base region of claim 1, wherein the Boron dopants are diffused and the Indium dopants are implanted.

5. The base region of claim 1, wherein at least one of the Boron dopants and the Indium dopants are diffused.

6. The base region of claim 1, wherein at least one of the Boron dopants and the Indium dopants are implanted.

7. The base region of claim 1, wherein base is formed by epitaxial growth.

8. The base region of claim 1 wherein the Indium to Boron ratio is selected to achieve a desired current gain temperature coefficient.

9. A NPN transistor comprising:

a collector of a N conductivity type formed in a substrate, the substrate having a working surface, a base of a P conductivity type formed in the collector adjacent the working surface of the substrate, wherein the P conductivity type is formed with both Boron and Indium dopants;

an emitter of the N conductivity type formed in the base adjacent the working surface of the substrate, wherein the concentration of Boron dopants is greater than the concentration of Indium dopants at an emitter-base junction; and wherein the concentration of Indium dopants is greater than the concentration of Boron dopants at a base-collector junction.

10. The NPN transistor of claim 9, wherein the ratio of Boron to Indium in the base is adjusted to provide a desired beta temperature coefficient.

11. The NPN transistor of claim 9, wherein the collector is low density N conductivity type and the emitter is high density N conductivity type.

12. The NPN transistor of claim 10, further comprising:

a collector contact of the N conductivity type with high density formed in the collector a select distance from the emitter and adjacent the working surface of the substrate.

13. A base region for a NPN transistor, the base region comprising:

Boron dopants;

Indium dopants, wherein the ratio of Indium dopants to Boron dopants is selected to create a desired current gain temperature coefficient;

wherein the concentration of Boron dopants is greater than the concentration of Indium dopants adjacent an emitter-base junction to set base resistance with the Boron dopants; and wherein the concentration of Indium dopants is greater than the concentration of Boron dopants adjacent a base-collector junction to achieve relatively high early voltage.

* * * * *